United States Patent
Ikegami

(10) Patent No.: US 11,404,970 B2
(45) Date of Patent: Aug. 2, 2022

(54) POWER CONVERTER

(71) Applicant: FUJI ELECTRIC CO., LTD., Kanagawa (JP)

(72) Inventor: Akira Ikegami, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 55 days.

(21) Appl. No.: 17/155,581

(22) Filed: Jan. 22, 2021

(65) Prior Publication Data
US 2021/0143748 A1    May 13, 2021

Related U.S. Application Data

(63) Continuation of application No. PCT/JP2019/030563, filed on Aug. 2, 2019.

(51) Int. Cl.
| | |
|---|---|
| *H05K 5/02* | (2006.01) |
| *H02M 7/00* | (2006.01) |
| *H02M 5/458* | (2006.01) |

(52) U.S. Cl.
CPC ......... *H02M 7/003* (2013.01); *H02M 5/4585* (2013.01); *H05K 5/0217* (2013.01)

(58) Field of Classification Search
CPC .. H02M 7/003; H02M 5/4585; H05K 5/0217; H05K 7/1432
See application file for complete search history.

(56) References Cited

U.S. PATENT DOCUMENTS 5,132,896 A * 7/1992 Nishizawa ........... H05K 7/1432
                                                                     363/141
8,422,235 B2 * 4/2013 Azuma ................. B60W 10/06
                                                                     361/699

(Continued)

FOREIGN PATENT DOCUMENTS

| JP | 2005-192296 | 7/2005 |
| JP | 2012-070632 | 4/2012 |
| WO | 2018/198290 | 11/2018 |

OTHER PUBLICATIONS

International Search Report dated Sep. 24, 2019 with respect to No. PCT/JP2019/030563.

(Continued)

*Primary Examiner* — James Wu
*Assistant Examiner* — Hung Q Dang
(74) *Attorney, Agent, or Firm* — IPUSA, PLLC

(57) ABSTRACT

A power converter includes a housing that accommodates at least one capacitor inside the housing, a first power conversion module including at least one first positive electrode and at least one first negative electrode, a second power conversion module including at least one second positive electrode and at least one second negative electrode, a first positive electrode busbar that connects a first electrode of the capacitor to the first positive electrode, a first negative electrode busbar that connects a second electrode of the capacitor to the second negative electrode, a second positive electrode busbar that is fixed to the first positive electrode together with the first positive electrode busbar and that is fixed to the second positive electrode, and a second negative electrode busbar that is fixed to the first negative electrode and that is fixed to the second negative electrode together with the first negative electrode busbar.

9 Claims, 9 Drawing Sheets

(56) References Cited

U.S. PATENT DOCUMENTS

2010/0089641 A1\* 4/2010 Esmaili ............... H05K 7/1432
174/70 B
2020/0195189 A1 6/2020 Kitamura et al.
2020/0279690 A1\* 9/2020 Kikkawa ................. H02G 5/02

OTHER PUBLICATIONS

Written Opinion of The International Searching Authority dated Sep. 24, 2019 with respect to No. PCT/JP2019/030563.

\* cited by examiner

POWER CONVERTER

CROSS-REFERENCE TO RELATED APPLICATION

This application is a continuation application of International Application No. PCT/JP2019/030563 filed on Aug. 2, 2019, and designating the U.S., the entire contents of which are incorporated herein by reference.

BACKGROUND OF THE INVENTION

1. Field of the Invention

The present disclosure relates to a power converter.

2. Description of the Related Art

An inverter device including a negative busbar that connects negative electrodes of respective power modules, a positive busbar that connects positive electrodes of respective power modules, and a smoothing capacitor connected to a center portion of the negative busbar and a center portion of the positive busbar is known (e.g., see Patent Document 1).

However, it is difficult to reduce assembly man-hours because the step of connecting the power module to a busbar is separate from the step of connecting a smoothing capacitor to a busbar.

Thus, the present disclosure provides a power converter that requires fewer man-hours to assemble.

RELATED-ART DOCUMENTS

Patent Document

Patent document 1: Japanese Laid-open Patent Application Publication No. 2005-192296

SUMMARY OF THE INVENTION

According to one embodiment of the present disclosure, a power converter includes a housing that has a first external surface facing in a first direction, a second external surface facing in a second direction that is perpendicular to the first direction, and a third external surface facing in a third direction that is opposite to the second direction, and that accommodates at least one capacitor inside the housing, a first power conversion module including at least one first positive electrode and at least one first negative electrode, the first power conversion module being positioned on the second external surface of the housing, a second power conversion module including at least one second positive electrode and at least one second negative electrode, the second power conversion module being positioned on the third external surface of the housing, a first positive electrode busbar that connects a first electrode of the capacitor to the first positive electrode, a first negative electrode busbar that connects a second electrode of the capacitor to the second negative electrode, a second positive electrode busbar that is fixed to the first positive electrode together with the first positive electrode busbar and that is fixed to the second positive electrode, and a second negative electrode busbar that is fixed to the first negative electrode and that is fixed to the second negative electrode together with the first negative electrode busbar.

According to at least one embodiment of the present disclosure, a power converter that requires fewer man-hours to assemble can be provided.

DETAILED DESCRIPTION OF THE EMBODIMENTS

In the following, an embodiment according to the present disclosure will be described with reference to the drawings. It should be noted that, in a parallel direction, a perpendicular direction, an orthogonal direction, a horizontal direction, a vertical direction, an up and down direction, a left and right direction, or the like, a difference is allowed as long as the difference does not reduce the effect of the present invention. The X-axis direction, the Y-axis direction, and the Z-axis direction respectively represent a direction parallel to the X-axis, a direction parallel to the Y-axis, and a direction parallel to the Z-axis. The X-axis direction, the Y-axis direction, and the Z-axis direction are orthogonal to each other. The XY-plane, the YZ-plane, and the ZX-plane respectively represent a virtual plane parallel to the X-axis direction and the Y-axis direction, a virtual plane parallel to the Y-axis direction and the Z-axis direction, and a virtual plane parallel to the Z-axis direction and the X-axis direction.

Figure 1:
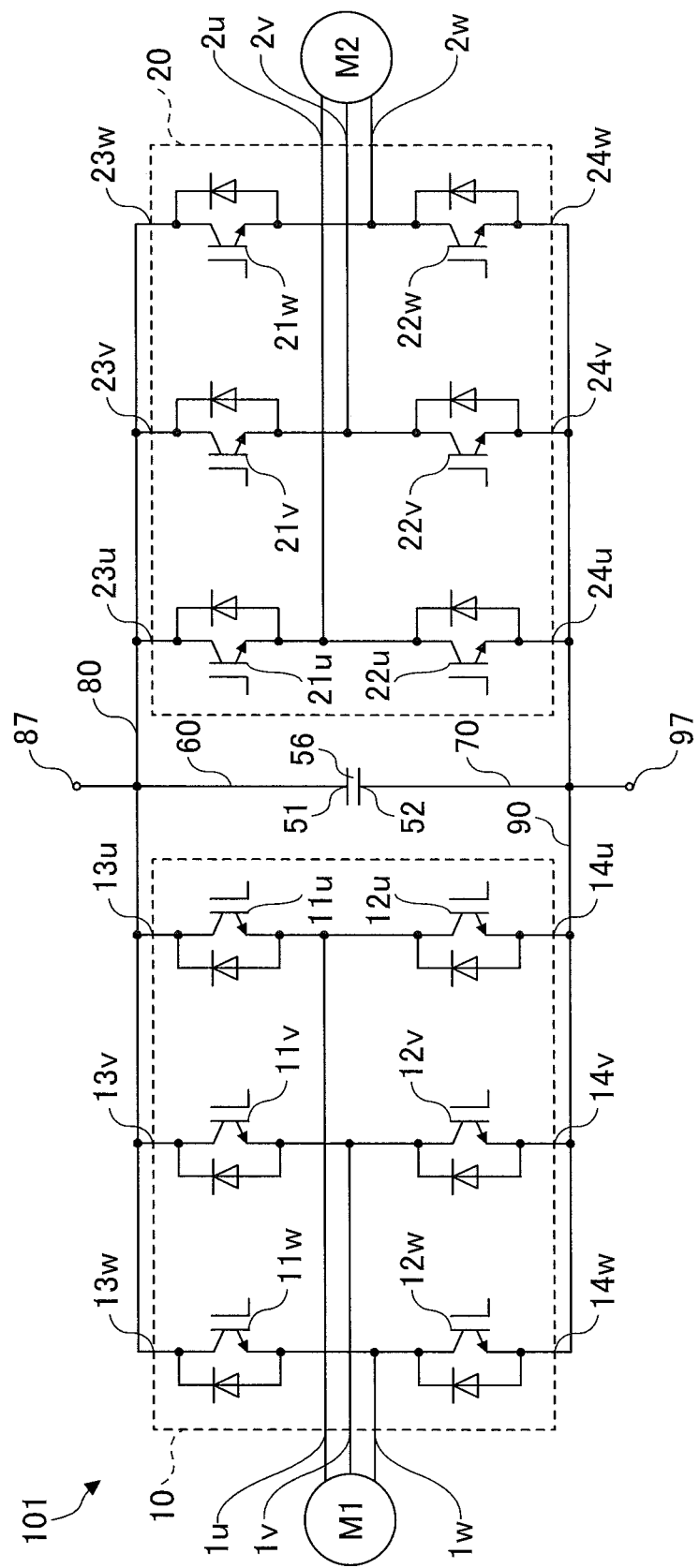
FIG. 1 is a circuit diagram illustrating an example configuration of a power converter.

FIG. 1 is a circuit diagram illustrating an example configuration of a power converter according to an embodiment. The power converter 101 illustrated in FIG. 1 is an inverter that converts DC input power supplied from a pair of power supply terminals 87 and 97 to desired AC output power. The power converter 101 includes a capacitor 56, a first power conversion module 10, a second power conversion module 20, a first positive electrode busbar 60, a first negative electrode busbar 70, a second positive electrode busbar 80, and a second negative electrode busbar 90.

The capacitor 56 is a capacitive element that smooths DC power supply voltage applied to the pair of the power supply terminals 87 and 97, and may be, for example, an electrolytic capacitor or the like. The capacitor 56 includes a first electrode 51 connected to the first positive electrode busbar 60 and a second electrode 52 connected to the first negative electrode busbar 70. The first electrode 51 is connected to the second positive electrode busbar 80 through the first positive electrode busbar 60. The second electrode 52 is connected to the second negative electrode busbar 90 through the first negative electrode busbar 70.

The second positive electrode busbar 80 and the second negative electrode busbar 90 are electrically conductive parts to which the DC power is supplied from a DC power supply (which is not illustrated) connected through the pair of power supply terminals 87 and 97. Specific examples of the DC power supply include a battery, a converter, a regulator, a rectifier circuit, and the like. The second negative electrode busbar 90 is a part whose potential is lower than the potential of the second positive electrode busbar 80. A DC power supply voltage is generated between the second negative electrode busbar 90 and the second positive electrode busbar 80.

The first power conversion module 10 generates three-phase AC power to drive a motor M1 by converting the DC power that is input to the pair of busbars 80 and 90 from the pair of power supply terminals 87 and 97. Similarly, the second power conversion module 20 generates three-phase AC power to drive a motor M2 by converting the DC power that is input to the pair of busbars 80 and 90 from the pair of power supply terminals 87 and 97.

For example, the first power conversion module 10 is used as a first power module to drive the motor M1 that rotates a first wheel of a vehicle, and the second power conversion module 20 is used as a second power module to drive the motor M2 that rotates a second wheel of a vehicle. The use of the power conversion module is not limited to this.

The first power conversion module 10 is a power semiconductor module including a three-phase bridge circuit including multiple switching elements $11u$, $11v$, $11w$, $12u$, $12v$, and $12w$. The first power conversion module 10 includes multiple first negative electrodes $14u$, $14v$, and $14w$ that are connected to the second negative electrode busbar 90, multiple first positive electrodes $13u$, $13v$, and $13w$ that are connected to the second positive electrode busbar 80, and multiple output electrodes $1u$, $1v$, and $1w$ that are connected to the motor M1.

The U-phase switching elements $11u$ and $12u$ are connected in series with each other, and a connecting node between the switching elements $11u$ and $12u$ is connected to the U-phase output electrode $1u$ that is connected to a U-phase coil of the motor M1. The V-phase switching elements $11v$ and $12v$ are connected in series with each other, and a connecting node between the switching elements $11v$ and $12v$ is connected to the V-phase output electrode $1v$ that is connected to a V-phase coil of the motor M1. The W-phase switching elements $11w$ and $12w$ are connected in series with each other, and a connecting node between the switching elements $11w$ and $12w$ is connected to the W-phase output electrode $1w$ that is connected to a W-phase coil of the motor M1.

Each of the high-side switching elements $11u$, $11v$, and $11w$ includes a first main electrode connected to a corresponding one of the first positive electrodes $13u$, $13v$, and $13w$, a second main electrode connected to a corresponding one of the output electrodes $1u$, $1v$, and $1w$, and a control electrode connected to a drive circuit (which is not illustrated). Each of the low-side switching elements $12u$, $12v$, and $12w$ includes a first main electrode connected to a corresponding one of the output electrodes $1u$, $1v$, and $1w$, a second main electrode connected to a corresponding one of the first negative electrodes $14u$, $14v$, and $14w$, and a control electrode connected to a drive circuit (which is not illustrated).

Similarly, the second power conversion module 20 is a power semiconductor module including a three-phase bridge circuit including multiple switching elements $21u$, $21v$, $21w$, $22u$, $22v$, and $22w$. The second power conversion module 20 includes multiple second negative electrodes $24u$, $24v$, and $24w$ connected to the second negative electrode busbar 90, multiple second positive electrodes $23u$, $23v$, and $23w$ connected to the second positive electrode busbar 80, and multiple output electrodes $2u$, $2v$, and $2w$ connected to the motor M2.

The U-phase switching elements $21u$ and $22u$ are connected in series with each other, and a connecting node between the switching elements $21u$ and $22u$ is connected to the U-phase output electrode $2u$ that is connected to a U-phase coil of the motor M2. The V-phase switching elements $21v$ and $22v$ are connected in series with each other, and a connecting node between the switching elements $21v$ and $22v$ is connected to the V-phase output electrode $2v$ that is connected to a V-phase coil of the motor M2. The W-phase switching elements $21w$ and $22w$ are connected in series with each other, and a connecting node between the switching elements $21w$ and $22w$ is connected to the W-phase output electrode $2w$ that is connected to a W-phase coil of the motor M2.

Each of the high-side switching elements $21u$, $21v$, $21w$ includes a first main electrode connected to a corresponding one of the second positive electrodes $23u$, $23v$, and $23w$, a second main electrode connected to a corresponding one of the output electrodes $2u$, $2v$, and $2w$, and a control electrode connected to a drive circuit (which is not illustrated). Each of the low-side switching elements $22u$, $22v$, $22w$ includes a first main electrode connected to a corresponding one of the output electrodes $2u$, $2v$, and $2w$, a second main electrode connected to a corresponding one of the second negative electrodes $24u$, $24v$, and $24w$, and a control electrode connected to a drive circuit (which is not illustrated).

Each of the switching elements $11u$, $11v$, $11w$, $12u$, $12v$, and $12w$ is connected in reverse parallel with a diode between the first main electrode and the second main electrode. Each of the switching elements $11u$, $11v$, $11w$, $12u$, $12v$, and $12w$ is a voltage-driven semiconductor element and includes a control electrode (i.e., a gate), a first main electrode (i.e., a collector or a drain), and a second main electrode (i.e., an emitter or a source). Examples of the switching element include a metal-oxide-semiconductor field-effect transistor (MOSFET), an insulated-gate bipolar transistor (IGBT), and the like. FIG. 1 illustrates a case in which each of the switching elements $11u$, $11v$, $11w$, $12u$, $12v$, and $12w$ is an IGBT including a gate, a collector, and an emitter.

The switching elements $11u$, $11v$, $11w$, $12u$, $12v$, and $12w$ may be switching elements including semiconductors such as silicon (Si), or switching elements including wide band gap semiconductors such as silicon carbides (SiC), gallium nitrides (GaN), gallium oxides (Ga2O3), and diamonds. The effect of loss reduction of the switching elements increases by applying the wide band gap semiconductors to the switching elements.

Next, an example configuration of the power converter 101 illustrated in FIG. 1 will be described with reference to FIGS. 2 to 9. The shape of each part illustrated in the drawings is provided merely as an example, and the present invention is not limited to this example.

Figure 2:
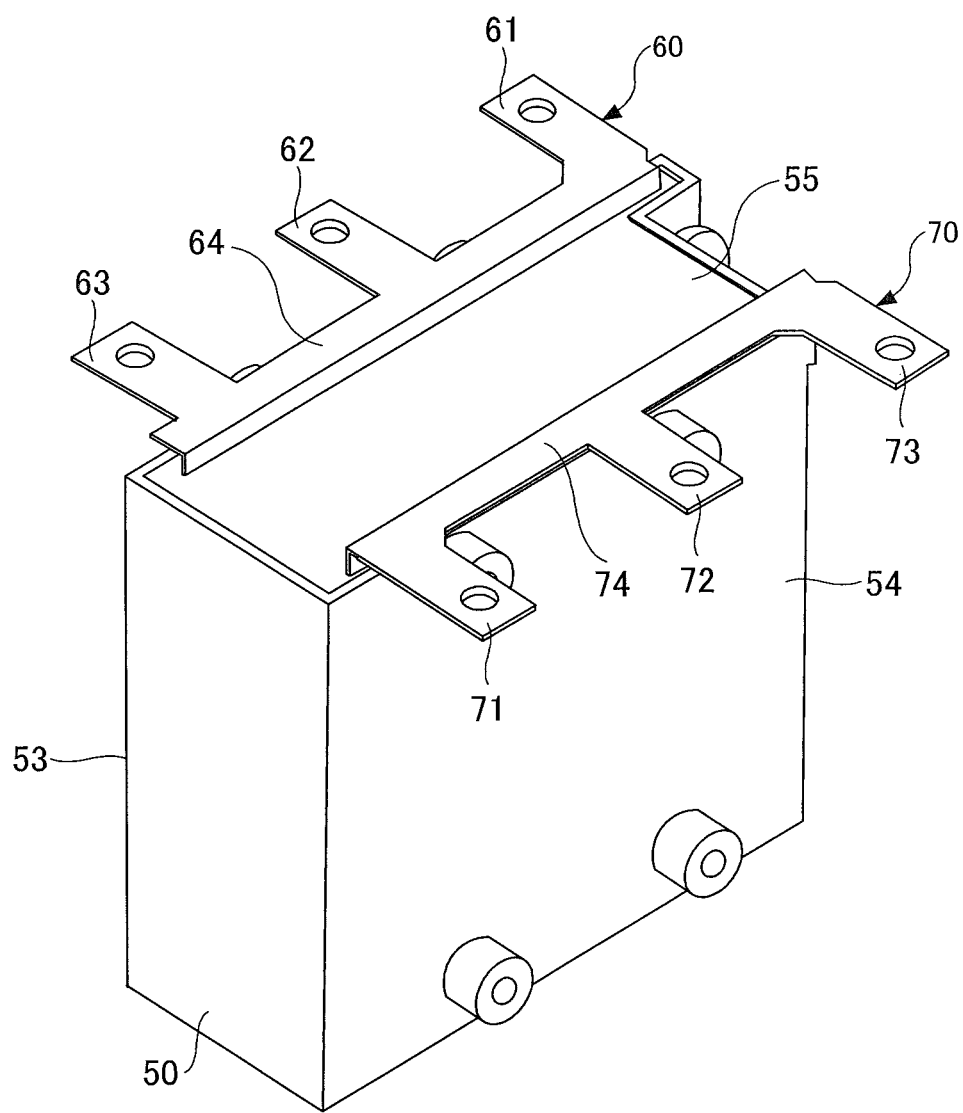
FIG. 2 is a perspective view of a housing accommodating a capacitor.

FIG. 2 is a perspective view of a housing accommodating a capacitor. The housing 50 illustrated in FIG. 2 has a first external surface 55, a second external surface 53, and a third external surface 54 and accommodates at least one capacitor 56 (see FIG. 1) inside the housing 50.

In FIG. 2, the external shape of the housing 50 is substantially a cuboid. The first external surface 55 is a housing surface facing in a first direction, and the first direction in the present example corresponds to the negative Y-axis direction. The second external surface 53 is a housing surface facing in a second direction that is perpendicular to the first direction, and the second direction in the present example corresponds to the positive Z-axis direction. The third external surface 54 is a housing surface facing in a third direction that is opposite to the second direction, and the third direction in the present example corresponds to the negative Z-axis direction.

In the housing 50, the capacitor 56 is surrounded by multiple external surfaces including the first external surface 55, the second external surface 53, and the third external surface 54. The second external surface 53 and the third external surface 54 are opposite to each other in the Z-axis direction. The second external surface 53 is connected to the first external surface 55 on the positive Z-axis side, and the third external surface 54 is connected to the first external surface 55 on the negative Z-axis side.

The first positive electrode busbar 60 and the first negative electrode busbar 70 are electrically conductive members and are formed of, for example, a tabular member. At least a portion of the first positive electrode busbar 60 and at least a portion of the first negative electrode busbar 70 are positioned on a first external surface 55 side of the housing 50. In the embodiment illustrated in FIG. 2, the first positive electrode busbar 60 and the first negative electrode busbar 70 are spaced apart from each other in the Z-axis direction and extend from the first external surface 55.

The first positive electrode busbar 60 is connected to the first electrode 51 of the capacitor 56 contained inside the housing 50. The first positive electrode busbar 60 may be a member seamlessly formed with the first electrode 51 or may be a member that is formed of a member different from the first electrode 51 and that is connected to the first electrode 51. The first positive electrode busbar 60 includes a first base portion 64 that extends from the first external surface 55 in the negative Y-axis direction and that bends in the positive Z-axis direction, and multiple first positive electrode terminals 61, 62, and 63 that extend from the first base portion 64 in the positive Z-axis direction. The multiple first positive electrode terminals 61, 62, 63 are flat tabular portions that are spaced apart from each other in the X-axis direction and that protrude from the first base portion 64 in the positive Z-axis direction.

The first negative electrode busbar 70 is connected to the second electrode 52 of the capacitor 56 contained inside the housing 50. The first negative electrode busbar 70 may be a member seamlessly formed with the second electrode 52 or may be a member that is formed of a member different from the second electrode 52 and that is connected to the second electrode 52. The first negative electrode busbar 70 includes a second base portion 74 that extends from the first external surface 55 in the negative Y-axis direction and that bends in the negative Z-axis direction, and multiple first negative electrode terminals 71, 72, and 73 that extend from the second base portion 74 in the negative Z-axis direction. The multiple first negative electrode terminals 71, 72, and 73 are flat tabular portions that are spaced apart from each other in the X-axis direction and that protrude from the second base portion 74 in the negative Z-axis direction.

Figure 3:
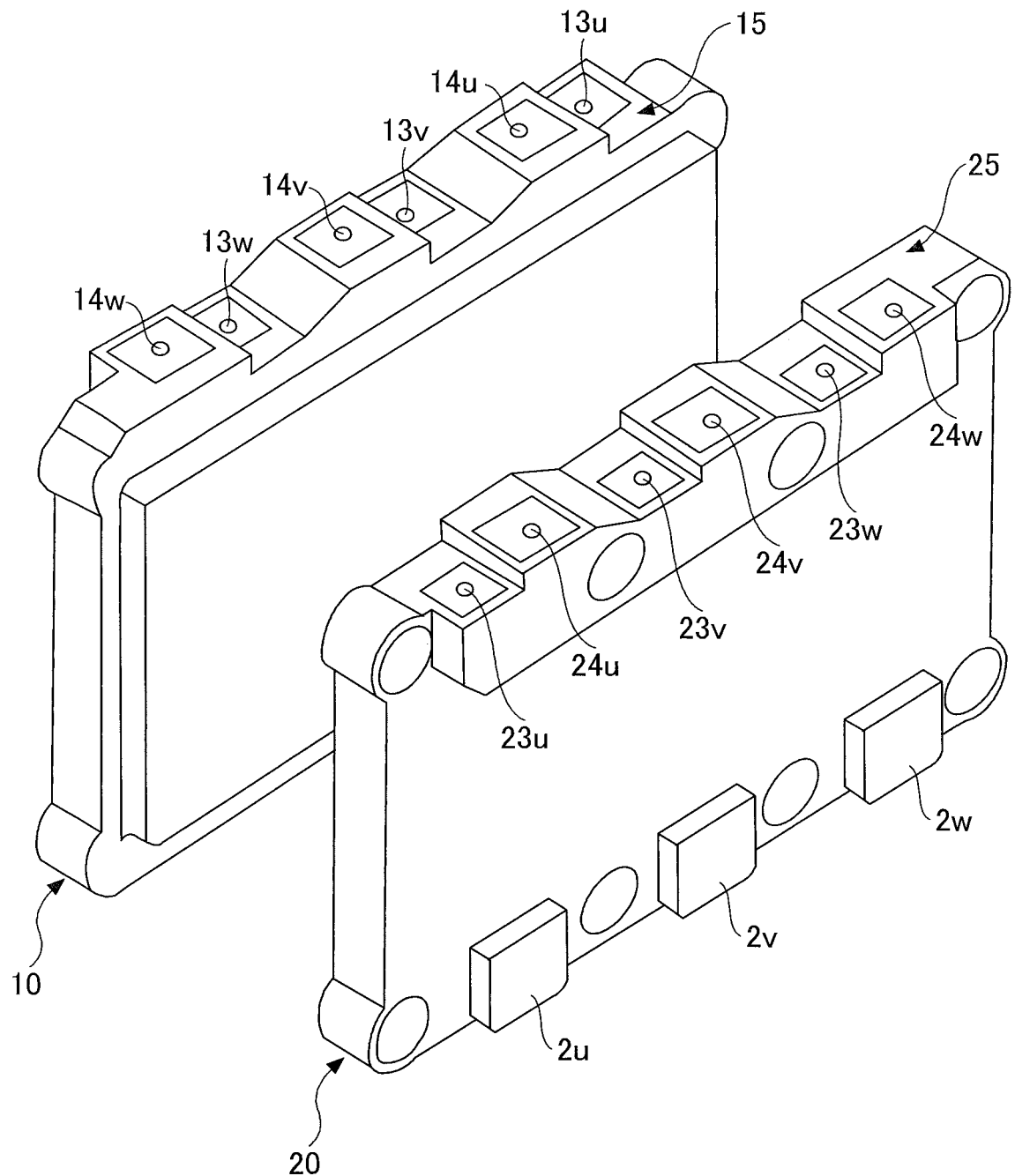
FIG. 3 is a perspective view of a pair of power conversion modules.

FIG. 3 is a perspective view of the pair of the power conversion modules illustrating a state in which the first power conversion module 10 and the second power conversion module 20 are spaced apart in the Z-axis direction. The external shape of both the first power conversion module 10 and the second power conversion module 20 is substantially a cuboid. The first power conversion module 10 and the second power conversion module 20 have the same configuration, so that the same types of components can be used in the first power conversion module 10 and the second power conversion module 20, thereby reducing the cost.

The first power conversion module 10 includes a three-phase bridge circuit including the multiple switching elements 11$u$, 11$v$, 11$w$, 12$u$, 12$v$, and 12$w$, described above, inside the housing that is substantially formed in a cuboid shape. The second power conversion module 20 includes a three-phase bridge circuit including the switching elements 21$u$, 21$v$, 21$w$, 22$u$, 22$v$, and 22$w$, described above, inside the housing that is substantially formed in a cuboid shape.

The first power conversion module 10 has an external surface (i.e., a housing surface 15 facing in the negative Y-axis direction in this example) on which the multiple first positive electrodes 13$u$, 13$v$, and 13$w$ and the multiple first negative electrodes 14$u$, 14$v$, and 14$w$ are formed. The multiple first positive electrodes 13$u$, 13$v$, and 13$w$ and the multiple first negative electrodes 14$u$, 14$v$, and 14$w$ are arrayed in the X-axis direction such that the positive electrodes and the negative electrodes are alternately arrayed. The multiple first positive electrodes 13$u$, 13$v$, and 13$w$ and the multiple first negative electrodes 14$u$, 14$v$, and 14$w$ are all square external electrodes, but the shape is not limited to this. In the multiple first positive electrodes 13$u$, 13$v$, and 13$w$ and the multiple first negative electrodes 14$u$, 14$v$, and 14$w$, fixed holes into which fixing bolts are to be inserted are formed. In the present example, the multiple first negative electrodes 14$u$, 14$v$, and 14$w$ that are formed to have the same height in the Y-axis direction are formed to be higher in the Y-axis direction than the multiple first positive electrodes 13$u$, 13$v$, and 13$w$ that are formed to have the same height in the Y-axis direction.

The second power conversion module 20 has an external surface (i.e., a housing surface 25 facing in the negative Y-axis direction in this example) on which the multiple second positive electrodes 23$u$, 23$v$, and 23$w$ and the multiple second negative electrodes 24$u$, 24$v$, and 24$w$ are formed. The multiple second positive electrodes 23$u$, 23$v$, and 23$w$ and the multiple second negative electrodes 24$u$, 24$v$, and 24$w$ are arrayed in the X-axis direction such that the positive electrodes and the negative electrodes are alternately arrayed. The multiple second positive electrodes 23$u$, 23$v$, and 23$w$ and the multiple second negative electrodes 24$u$, 24$v$, and 24$w$ are all square external electrodes, but the shape is not limited to this. In the multiple second positive electrodes 23$u$, 23$v$, and 23$w$ and the multiple second negative electrodes 24$u$, 24$v$, and 24$w$, fixed holes into which fixing bolts to be inserted are formed. In the present example, the multiple second negative electrodes 24$u$, 24$v$, and 24$w$ that are formed to have the same height in the Y-axis direction are formed to be higher in the Y-axis direction than the second positive electrodes 23$u$, 23$v$, and 23$w$ that are formed to have the same height in the Y-axis direction.

The second power conversion module 20 has an external surface (i.e., a housing surface facing in the positive Y-axis direction or in the negative Z-axis direction in this example) on which the multiple output electrodes 2$u$, 2$v$, and 2$w$ for connecting to the motor M2 are formed. Although hidden in FIG. 3, the first power conversion module 10 has an external surface (i.e., a housing surface facing in the positive Y-axis direction or in the positive Z-axis direction in the present example) on which the multiple output electrodes 1$u$, 1$v$, and 1w for connecting to the motor M1 are formed. The external surfaces on which the multiple output electrodes 1u, 1v, and 1w and the multiple output electrodes 2u, 2v, and 2w are formed may be other housing surfaces.

Figure 4:
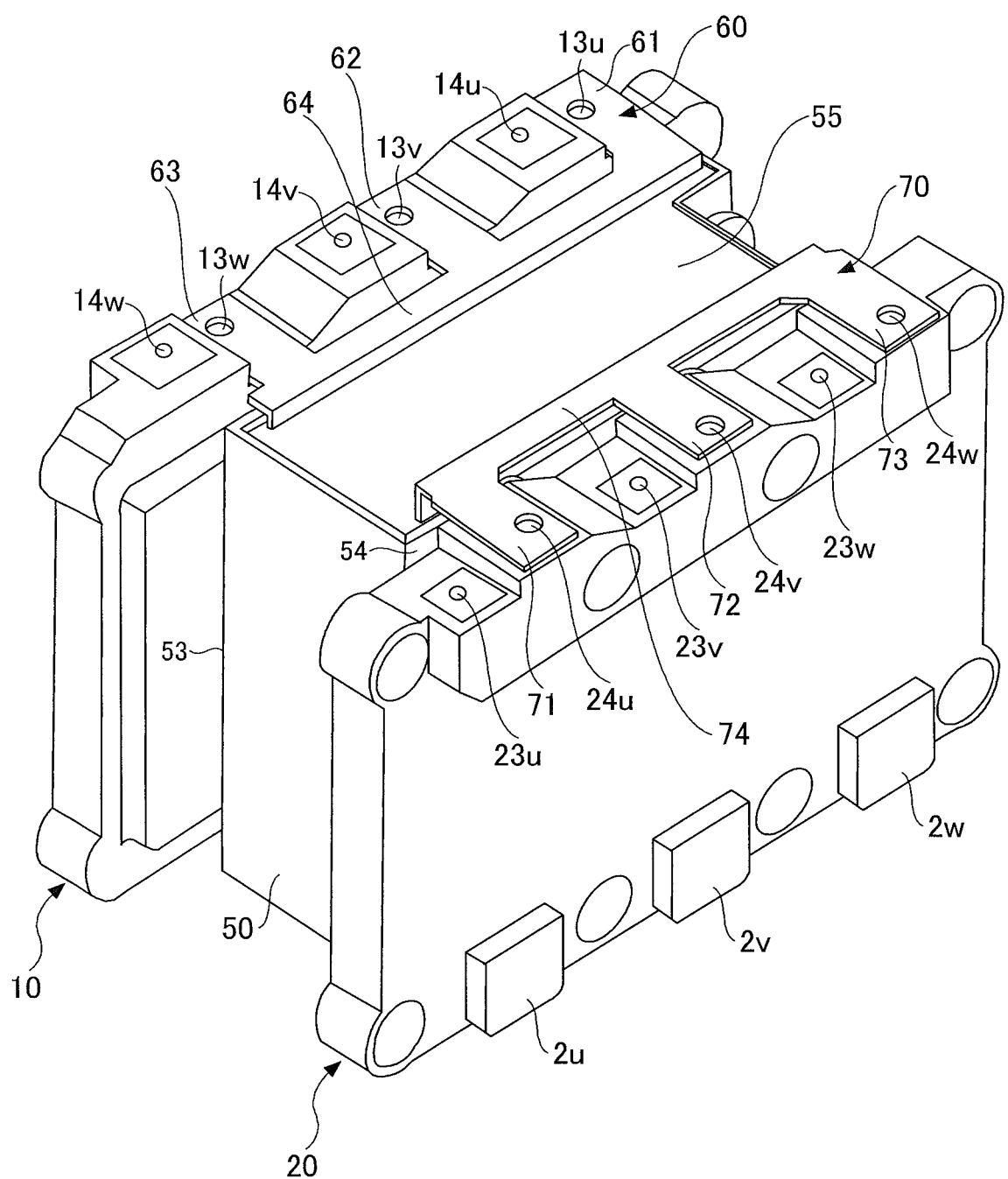
FIG. 4 is a perspective view illustrating a configuration in which the pair of power conversion modules is assembled to the housing.

FIG. 4 is a perspective view illustrating a configuration in which the pair of the power conversion modules is assembled to the housing. The first power conversion module 10 is positioned on a second external surface 53 side of the housing 50 and is fixed to the second external surface 53 with a fastening member such as a bolt inserted from the positive Z-axis direction, for example. The second power conversion module 20 is positioned on a third external surface 54 side of the housing 50 and is fixed to the third external surface 54 with a fastening member such as a bolt inserted from the negative Z-axis direction.

The first positive electrode busbar 60 connects the first electrode 51 of the capacitor 56 inside the housing 50 to the multiple first positive electrodes 13u, 13v, and 13w. The first positive electrode busbar 60 includes the multiple first positive electrode terminals 61, 62, and 63 each of which is fixed in contact with a corresponding positive electrode of the multiple first positive electrodes 13u, 13v, and 13w. Fixing holes into which fixing bolts are to be inserted are respectively formed in the multiple first positive electrode terminals 61, 62 and 63.

The first negative electrode busbar 70 connects the second electrode 52 of the capacitor 56 inside the housing 50 to the multiple second negative electrodes 24u, 24v, and 24w. The first negative electrode busbar 70 includes the multiple first negative electrode terminals 71, 72, 73 each of which is fixed in contact with a corresponding negative electrode of the multiple second negative electrodes 24u, 24v, and 24w. Fixing holes into which fixing bolts are to be inserted are respectively formed in the multiple first negative electrode terminals 71, 72, and 73.

Figure 5:
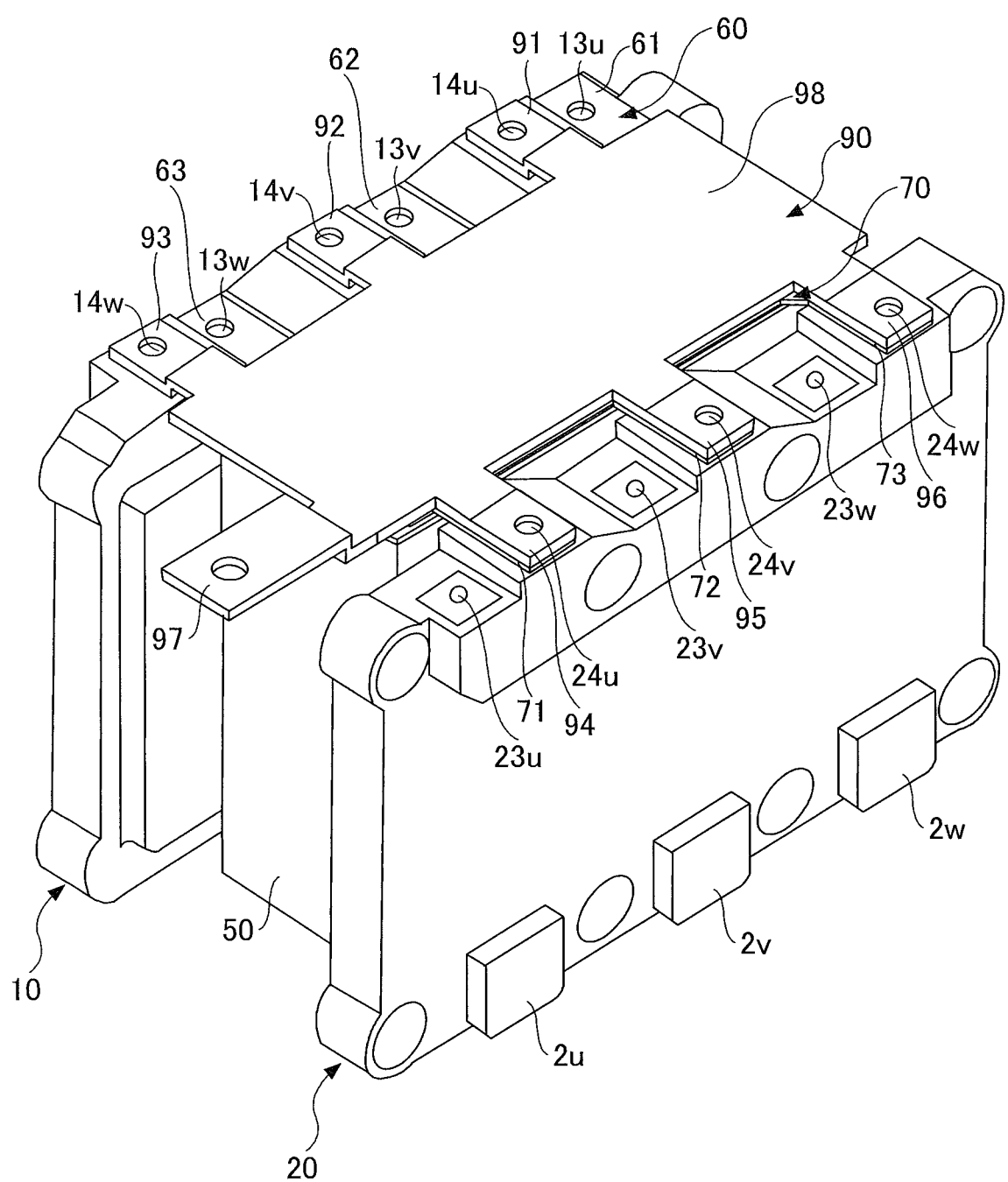
FIG. 5 is a perspective view illustrating a configuration in which a second negative busbar is assembled to the configuration of FIG. 4.

FIG. 5 is a perspective view illustrating a configuration in which the second negative electrode busbar is assembled to the configuration of FIG. 4. The second negative electrode busbar 90 is assembled such that at least a portion of the first positive electrode busbar 60 and at least a portion of the first negative electrode busbar 70 are positioned between the second negative electrode busbar 90 and the first external surface 55 of the housing 50.

The second negative electrode busbar 90 is an electrically conductive member that conductively connects the multiple first negative electrodes 14u, 14v, and 14w to the multiple second negative electrodes 24u, 24v, and 24w, and is formed of, for example, a tabular member. The second negative electrode busbar 90 is formed of a single member, but may be formed of multiple members. The second negative electrode busbar 90 includes a rectangular negative electrode plate 98 parallel to the ZX plane, multiple second negative electrode terminals 94, 95, and 96 extending in the negative Z-axis direction from the negative electrode plate 98, multiple third negative electrode terminals 91, 92, and 93 extending in the positive Z-axis direction from the negative electrode plate 98, and a negative electrode power supply terminal 97 extending in the negative X-axis direction from the negative electrode plate 98.

The negative electrode power supply terminal 97 extends in a fourth direction that is perpendicular to both the first direction and the second direction, and is an example of a terminal for connecting to a negative electrode side of the DC power supply (which is not illustrated). The fourth direction in the present example corresponds to the negative X-axis direction.

The multiple second negative electrode terminals 94, 95, and 96 are flat tabular portions that are spaced apart from each other in the X-axis direction and that protrude from the negative electrode plate 98 in the negative Z-axis direction. The multiple third negative electrode terminals 91, 92, and 93 are flat tabular portions that are spaced apart from each other in the X-axis direction and that protrude from the negative electrode plate 98 in the positive Z-axis direction. The negative electrode power supply terminal 97 is a flat tabular portion that protrudes from the negative electrode plate 98 in the negative X-axis direction.

The second negative electrode busbar 90 includes the multiple second negative electrode terminals 94, 95, 96, each of which is fixed to a corresponding negative electrode of the multiple second negative electrode 24u, 24v, and 24w, and the multiple third negative electrode terminals 91, 92, and 93, each of which is fixed to a corresponding negative electrode of the multiple first negative electrodes 14u, 14v, and 14w. In the present example, the multiple first negative electrode terminals 71, 72, and 73 of the first negative electrode busbar 70 are sandwiched between the multiple second negative electrode terminals 94, 95, and 96 and the multiple second negative electrode 24u, 24v, and 24w. Each of the multiple second negative electrode terminals 94, 95, and 96 contacts a corresponding negative electrode terminal of the multiple first negative electrode terminals 71, 72, and 73. Each of the multiple third negative electrode terminals 91, 92, and 93 contacts a corresponding negative electrode of the multiple first negative electrodes 14u, 14v, and 14w. A fixed hole, into which a fixing bolt is to be inserted, is formed in each of the multiple second negative electrode terminals 94, 95, and 96 and the multiple third negative electrode terminals 91, 92, and 93.

Figure 6:
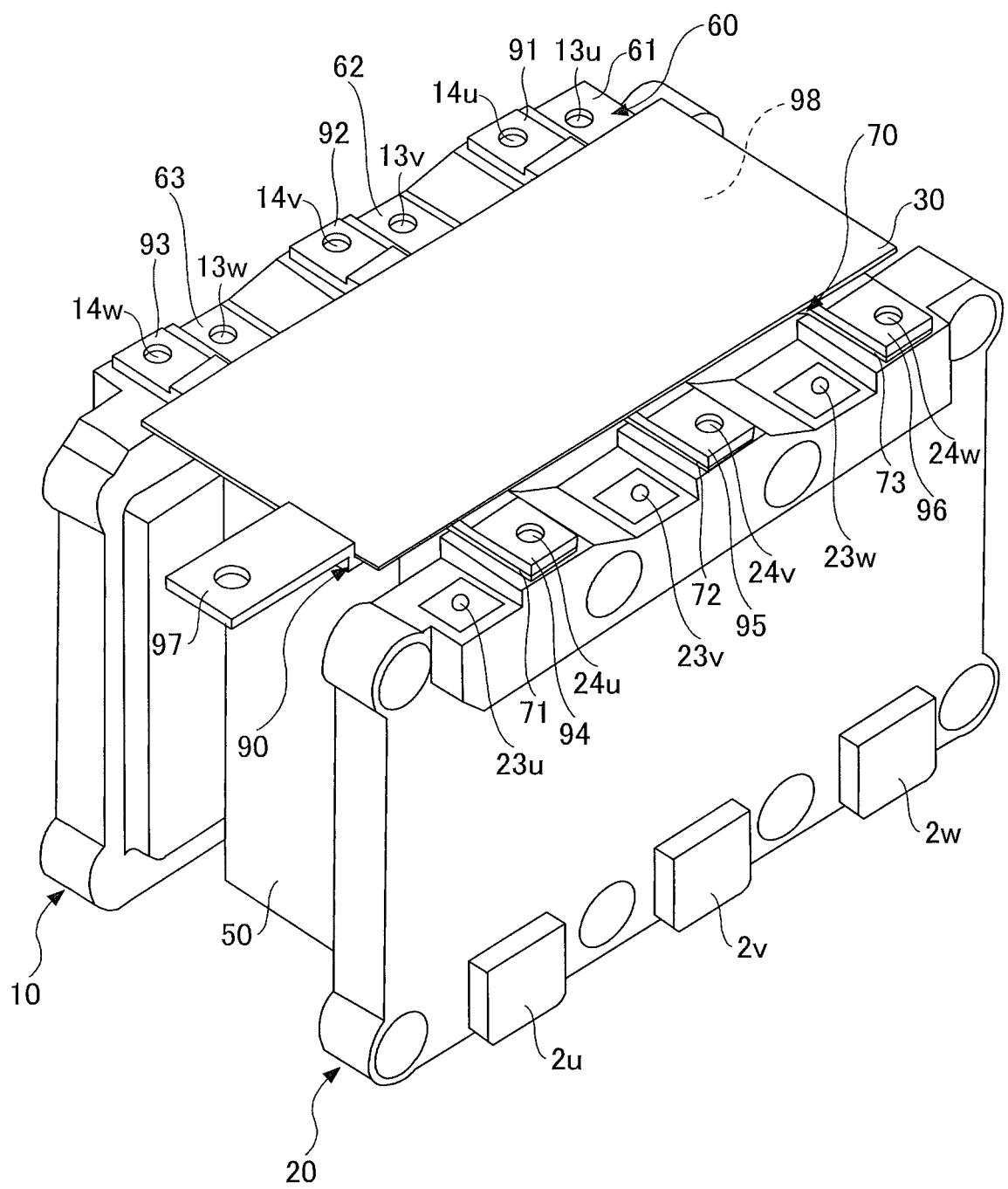
FIG. 6 is a perspective view illustrating a configuration in which an insulating sheet is assembled to the configuration of FIG. 5.

FIG. 6 is a perspective view illustrating a configuration in which an insulating sheet 30 is assembled to the configuration of FIG. 5. The insulating sheet 30 is an insulator positioned so as to face the negative electrode plate 98 of the second negative electrode busbar 90. The shape of the insulating sheet 30 is rectangular, but is not limited to this shape.

Figure 7:
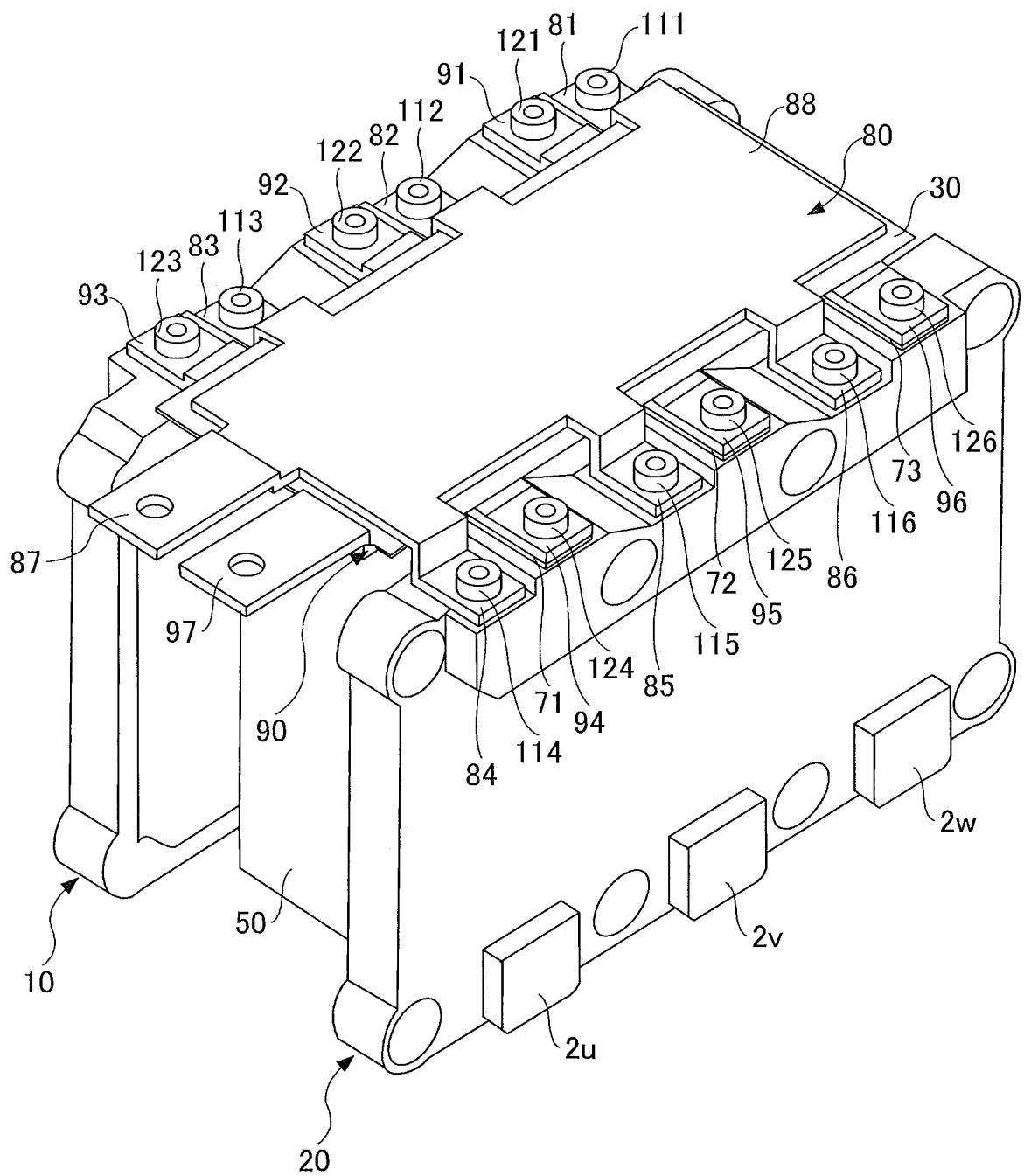
FIG. 7 is a perspective view illustrating a configuration in which a second positive electrode busbar is assembled to the configuration of FIG. 6 (i.e., the power converter)

FIG. 7 is a perspective view illustrating a configuration in which the second positive electrode busbar is assembled to the configuration of FIG. 6 (i.e., the power converter). The second positive electrode busbar 80 is assembled such that at least a portion of the insulating sheet 30 is positioned between the second positive electrode busbar 80 and the second negative electrode busbar 90. The insulating sheet 30 is sandwiched between the negative electrode plate 98 of the second negative electrode busbar 90 and the positive electrode plate 88 of the second positive electrode busbar 80, thereby preventing the occurrence of an electrical short circuit between the second negative electrode busbar 90 and the second positive electrode busbar 80 overlapping each other.

The second positive electrode busbar 80 is an electrically conductive member that conductively connects the multiple the first positive electrodes 13u, 13v, and 13w and the multiple second positive electrodes 23u, 23v, and 23w to each other, and is formed of, for example, a tabular member. The second positive electrode busbar 80 is formed of a single member, but may be formed of multiple members. The second positive electrode busbar 80 includes the rectangular positive electrode plate 88 parallel to the ZX plane, multiple second positive electrode terminals 81, 82, and 83 extending in the positive Z-axis direction from the positive electrode plate 88, multiple third positive electrode terminals 84, 85, and 86 extending in the negative Z-axis direction from the positive electrode plate 88, and the positive electrode power supply terminal 87 extending in the negative X-axis direction from the positive electrode plate 88.

The positive electrode power supply terminal 87 extends in the fourth direction (which corresponds to the negative X-axis direction in the present example) that is perpendicular to both the first direction and the second direction, and is an example of a terminal for connecting to a positive electrode side of the DC power supply (which is not illustrated).

The multiple second positive electrode terminals 81, 82, and 83 are flat tabular portions that are spaced apart from each other in the X-axis direction and that protrude from the positive electrode plate 88 in the positive Z-axis direction. The multiple third positive electrode terminals 84, 85, and 86 are flat tabular portions that are spaced apart from each other in the X-axis direction and that protrude from the positive electrode plate 88 in the negative Z-axis direction. The positive electrode power supply terminal 87 is a flat tabular portion that protrude from the positive electrode plate 88 in the negative X-axis direction.

Referring to FIG. 7 in comparison with FIG. 6, the second positive electrode busbar 80 includes the multiple second positive electrode terminals 81, 82, and 83, each of which is fixed to a corresponding positive electrode terminal of the multiple first positive electrodes 13u, 13v, and 13w, and the multiple third positive electrode terminals 84, 85, and 86, each of which fixed to a corresponding positive electrode of the multiple second positive electrodes 23u, 23v, and 23w. In the present example, the multiple first positive electrode terminals 61, 62, and 63 of the first positive electrode busbar 60 (see FIG. 6) are sandwiched between the multiple second positive electrode terminals 81, 82, and 83 (see FIG. 7) and the multiple first positive electrode 13u, 13v, and 13w (see FIG. 6). Each of the multiple second positive electrode terminals 81, 82, and 83 contacts a corresponding positive electrode terminal of the multiple first positive electrode terminals 61, 62, and 63. Each of the multiple third positive electrode terminals 84, 85, and 86 contacts a corresponding positive electrode of the multiple second positive electrodes 23u, 23v, and 23w. A fixing hole, into which a fixing bolt is to be inserted, is formed in each of the multiple second positive electrode terminals 81, 82, and 83 and the multiple third positive electrode terminals 84, 85, and 86.

As illustrated in FIGS. 6 and 7, the multiple second positive electrode terminals 81, 82, and 83 of the second positive electrode busbar 80 are fixed to the first positive electrode 13u, 13v, and 13w with fixing members such as bolts 111, 112, and 113 together with the first positive electrode terminals 61, 62, and 63 of the first positive electrode busbar 60. The multiple third positive electrode terminals 84, 85, and 86 of the second positive electrode busbar 80 are fixed to the second positive electrodes 23u, 23v, and 23w with fixing members such as bolts 114, 115, and 116. With respect to the above, the multiple second negative electrode terminals 94, 95, and 96 of the second negative electrode busbar 90 are fixed to the second negative electrode 24u, 24v, and 24w with fixing members such as bolts 124, 125, and 126 together with the first negative electrode terminals 71, 72, and 73 of the first negative electrode busbar 70. The multiple third negative electrode terminals 91, 92, and 93 of the second negative electrode busbar 90 are fixed to the first negative electrode 14u, 14v, and 14w with fixing members such as bolts 121, 122, and 123.

As described above, the second positive electrode busbar 80 is fixed to the multiple first positive electrodes 13u, 13v, and 13w together with the first positive electrode busbar 60, so that the second positive electrode busbar 80, the first power conversion module 10, and the housing 50 can be easily assembled, thereby reducing assembly man-hours. In addition to this assembly, an electrical connection between the second positive electrode busbar 80, the multiple first positive electrodes 13u, 13v, and 13w, and the first electrode 51 of the capacitor 56 can be achieved. Similarly, the second negative electrode busbar 90 is fixed to the multiple second negative electrodes 24u, 24v, and 24w together with the first negative electrode busbar 70, so that the second negative electrode busbar 90, the second power conversion module 20, and the housing 50 can be easily assembled, thereby reducing assembly man-hours. In addition to this assembly, an electrical connection between the second negative electrode busbar 90, the multiple second negative electrodes 24u, 24v, and 24w, and the second electrode 52 of the capacitor 56 can be achieved. Thus, according to the configuration of the power converter 101 of the present embodiment, the man-hours needed to assemble the power converter 101 can be reduced.

Figure 8:
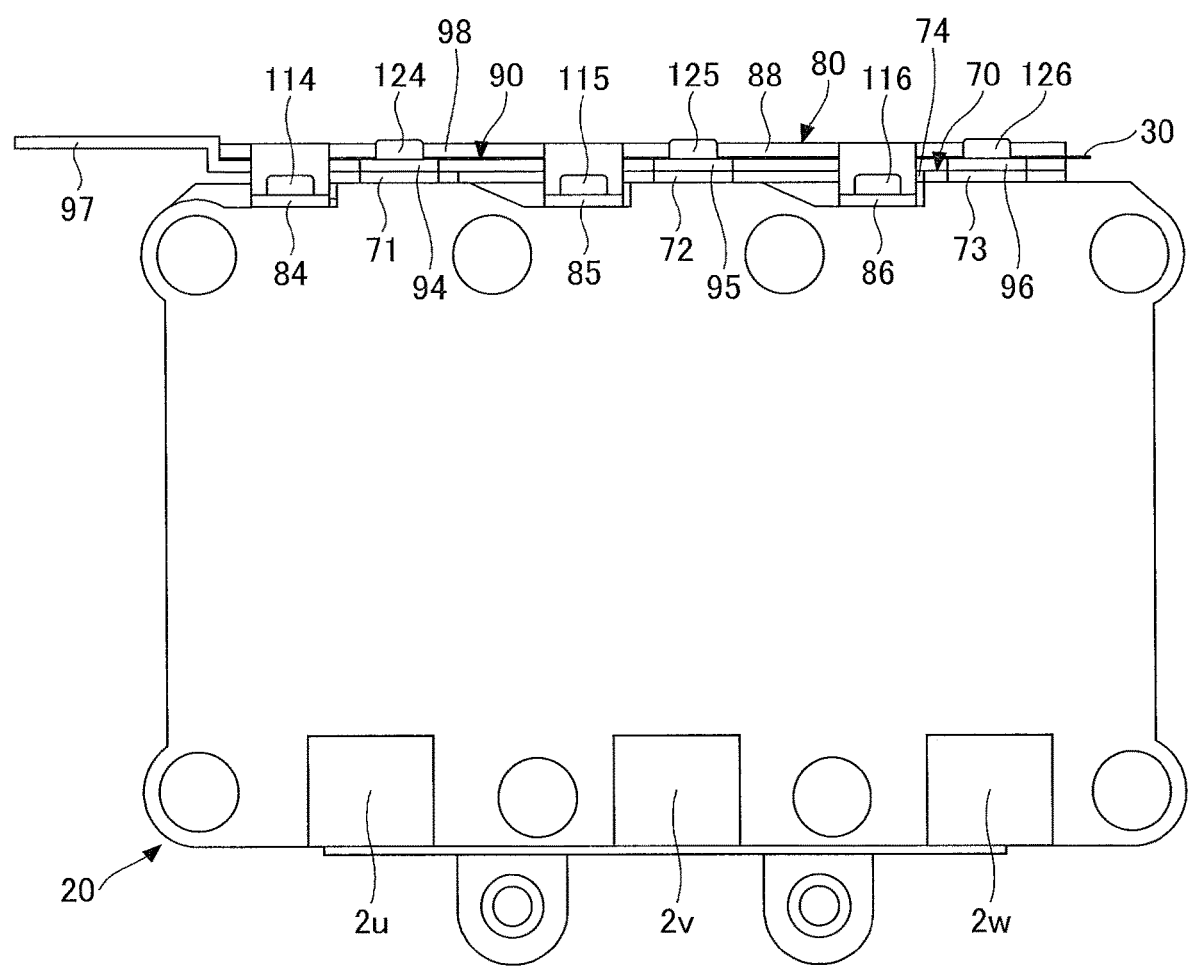
FIG. 8 is a side view of the power converter.
Figure 9:
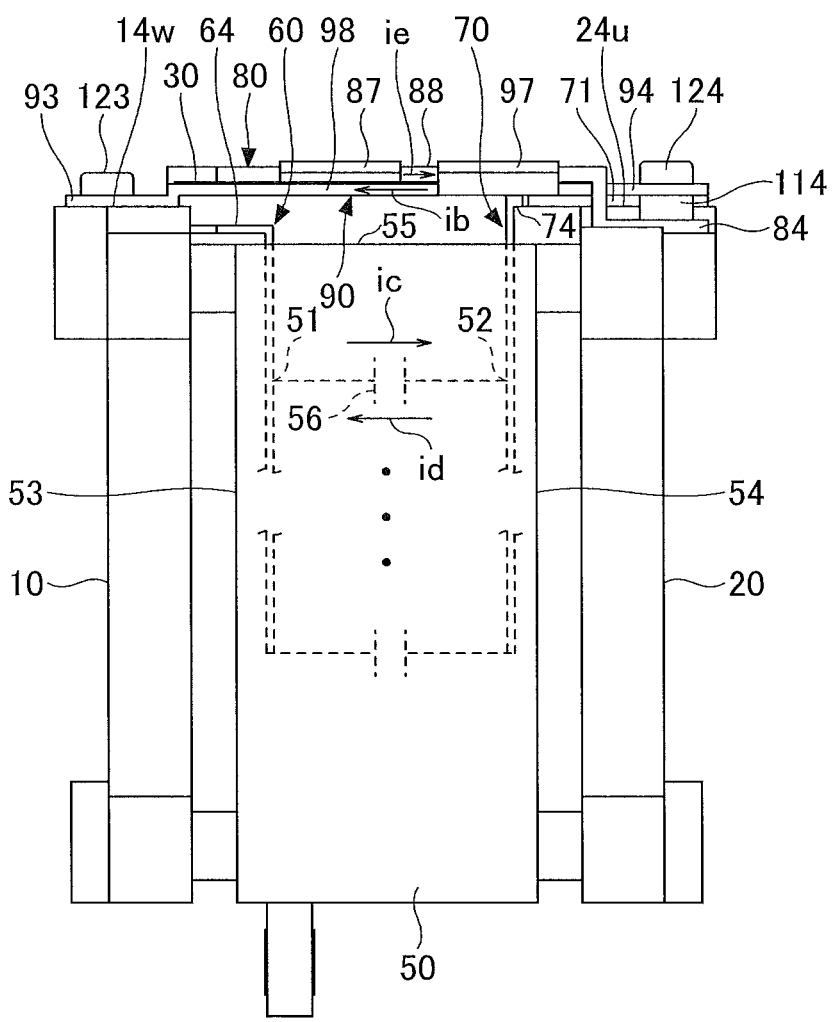
FIG. 9 is a front view of the power converter.

FIG. 8 is a side view of the power converter viewed from the negative Z-axis direction. FIG. 9 is a front view of the power converter viewed from the negative X-axis direction.

When the power converter is viewed from the negative X-axis direction, the second negative electrode busbar 90 is provided so as to include a conductor in which a current ib flows in a direction opposite to the direction in which the current ic flows through the capacitor 56 from the first electrode 51 to the second electrode 52. The conductor is the negative electrode plate 98 disposed parallel to the direction of the current ic flowing through the capacitor 56 in the present example. By providing such a conductor, the direction of a magnetic field produced by the current ic and a direction of a magnetic field produced by the current ib become opposite to each other, thereby reducing the inductance of paths in which the current ib and the current ic flow. As a result, surge voltage generated upon switching of each switching element can be suppressed, and thus, heat generation of the power conversion module can be reduced, thereby achieving a high efficiency of the power converter. The current ic is a current in a direction in which the capacitor 56 is charged.

For example, the current flows in the order of the first positive electrodes 13u, 13v, and 13w, the first positive electrode busbar 60, the capacitor 56, the first negative electrode busbar 70, the second negative electrode terminals 94, 95, and 96, the negative electrode plate 98, the third negative electrode terminals 91, 92, and 93, and the first negative electrodes 14u, 14v, and 14w.

When the power converter is viewed from the negative X-axis direction, the second positive electrode busbar 80 is provided so as to include a conductor in which a current ie flows in a direction opposite to the direction of a current id flowing through the capacitor 56 from the second electrode 52 to the first electrode 51. The conductor is the positive electrode plate 88 disposed parallel to the direction of the current id flowing through the capacitor 56 in this example. By providing such a conductor, the direction of a magnetic field produced by the current id and the direction of a magnetic field produced by the current ie become opposite to each other, thereby reducing the inductance of paths in which the current id and the current ie flow. As a result, surge voltage generated upon switching of each switching element can be suppressed, and thus, heat generation of the power conversion module can be reduced, thereby achieving a high efficiency of the power converter. The current id is a current in a direction in which the capacitor 56 is discharged.

For example, the current flows in the order of the second negative electrodes 24u, 24v, and 24w, the first negative electrode busbar 70, the capacitor 56, the first positive electrode busbar 60, the second positive electrode terminals 81, 82, and 83, the positive electrode plate 88, the third positive electrode terminals 84, 85, and 86, and the second positive electrodes 23u, 23v, and 23w.

Although the power converter has been described according the embodiment, the present invention is not limited to the embodiment described above. Various alterations and modifications, such as a combination or substitution with a part or an entire of another embodiment, can be made within the scope of the present invention.

For example, the power converter according to the present disclosure is not limited to an inverter that generates three-phase AC, but may be an inverter that generates AC other than three-phase AC.

The power converter according to the present disclosure is not limited to an inverter that converts DC to AC, but may be a converter that converts DC to DC. Examples of such a converter include a step-up converter that boosts and outputs an input voltage, a step-down converter that lowers and outputs an input voltage, and a step-up/step-down converter that boosts or lowers and outputs an input voltage. When the converter is a power converter, the techniques of the present disclosure can be applied to a configuration including a first power conversion module that converts a DC input voltage smoothed by a capacitor to provide a DC output voltage to a first load, and a second power conversion module that converts a DC input voltage smoothed by the capacitor to provide a DC output voltage to a second load.

In the power conversion module, each of the first positive electrode, the first negative electrode, the second positive electrode, and the second negative electrode is not limited to being provided as separate electrodes. Some of the first positive electrode, the first negative electrode, the second positive electrode, and the second negative electrode may be a single electrode that is shared. In accordance with the number of respective electrodes of the first positive electrodes, the first negative electrodes, the second positive electrodes, and the second negative electrodes, the number of terminals of each busbar may be set to one or more.

Additionally, the lamination order of the second positive electrode busbar and the second negative electrode busbar in the Y-axis direction is not limited to the illustrated embodiment, and the lamination order of both busbars may be reversed.

In FIG. 3, the multiple first negative electrodes 14u, 14v, and 14w may be replaced by positive electrodes to which high-side switching elements are connected, and the multiple first positive electrodes 13u, 13v, and 13w may be replaced by negative electrodes to which low-side switching elements are connected. Similarly, in FIG. 3, the multiple second negative electrodes 24u, 24v, and 24w may be replaced by positive electrodes to which high-side switching elements are connected, and the multiple second positive electrodes 23u, 23v, and 23w may be replaced by negative electrodes to which low-side switching elements are connected.

What is claimed is:

1. A power converter comprising:
a housing that has a first external surface facing in a first direction, a second external surface facing in a second direction that is perpendicular to the first direction, and a third external surface facing in a third direction that is opposite to the second direction, and that accommodates at least one capacitor inside the housing;
a first power conversion module including at least one first positive electrode and at least one first negative electrode, the first power conversion module being positioned on the second external surface of the housing;
a second power conversion module including at least one second positive electrode and at least one second negative electrode, the second power conversion module being positioned on the third external surface of the housing;
a first positive electrode busbar that connects a first electrode of the capacitor to the first positive electrode;
a first negative electrode busbar that connects a second electrode of the capacitor to the second negative electrode;
a second positive electrode busbar that is fixed to the first positive electrode together with the first positive electrode busbar and that is fixed to the second positive electrode; and
a second negative electrode busbar that is fixed to the first negative electrode and that is fixed to the second negative electrode together with the first negative electrode busbar.

2. The power converter as claimed in claim 1,
wherein the first positive electrode busbar includes at least one first positive electrode terminal that extends in the second direction and that is fixed to the first positive electrode together with the second positive electrode busbar, and
wherein the first negative electrode busbar includes at least one first negative electrode terminal that extends in the third direction and that is fixed to the second negative electrode together with the second negative electrode busbar.

3. The power converter as claimed in claim 2,
wherein the second positive electrode busbar includes at least one second positive electrode terminal that extends in the second direction and that is fixed to the first positive electrode together with the first positive electrode terminal, and
wherein the second negative electrode busbar includes at least one second negative electrode terminal that extends in the third direction and that is fixed to the second negative electrode together with the first negative electrode terminal.

4. The power converter as claimed in claim 3,
wherein the second positive electrode busbar includes at least one third positive electrode terminal that extends in the third direction and that is fixed to the second positive electrode, and
wherein the second negative electrode busbar includes at least one third negative electrode terminal that extends in the second direction and that is fixed to the first negative electrode.

5. The power converter as claimed in claim 4,
wherein the second positive electrode busbar includes a positive electrode power supply terminal that connects to a positive electrode side of a power supply,
wherein the second negative electrode busbar includes a negative electrode power supply terminal that connects to a negative electrode side of the power supply, and
wherein the positive electrode power supply terminal and the negative electrode power supply terminal extend in a fourth direction that is perpendicular to both the first direction and the second direction.

6. The power converter as claimed in claim 1, wherein at least a portion of the first positive electrode busbar and at least a portion of the first negative electrode busbar are positioned on the first external surface of the housing.

7. The power converter as claimed in claim 6, wherein at least a portion of the first positive electrode busbar and at least a portion of the first negative electrode busbar are positioned between the second positive electrode busbar or the second negative electrode busbar and the first external surface.

8. The power converter as claimed in claim 7, wherein the second positive electrode busbar overlaps with the second negative electrode busbar.

9. The power converter as claimed in claim 1, wherein, in a case where the power converter is viewed from a fourth direction that is perpendicular to both the first direction and the second direction, the second negative electrode busbar includes a conductor in which a current flows in a direction that is opposite to a direction of a current flowing through the capacitor from the first electrode to the second electrode, and the second positive electrode busbar includes a conductor in which a current flows in a direction that is opposite to a direction of a current flowing through the capacitor from the second electrode to the first electrode.

* * * * *